US007796107B2

(12) United States Patent
Kim

(10) Patent No.: US 7,796,107 B2
(45) Date of Patent: Sep. 14, 2010

(54) ORGANIC LIGHT EMITTING DISPLAY

(75) Inventor: Yang Wan Kim, Yongin (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 761 days.

(21) Appl. No.: 11/693,585

(22) Filed: Mar. 29, 2007

(65) Prior Publication Data

US 2008/0036371 A1    Feb. 14, 2008

(30) Foreign Application Priority Data

Aug. 8, 2006    (KR) ...................... 10-2006-0074588

(51) Int. Cl.
*G09G 3/30* (2006.01)
(52) U.S. Cl. ........................... 345/92; 345/76; 345/205; 345/206
(58) Field of Classification Search ...................... None
See application file for complete search history.

(56) References Cited

U.S. PATENT DOCUMENTS

| 6,954,194 | B2 * | 10/2005 | Matsumoto et al. ........... 345/92 |
| 7,126,593 | B2 * | 10/2006 | Matsumoto ................. 345/205 |
| 7,595,778 | B2 * | 9/2009 | Osame et al. ................. 345/76 |
| 2003/0132896 | A1 | 7/2003 | Matsueda |
| 2004/0207583 | A1* | 10/2004 | Koo et al. ..................... 345/82 |
| 2004/0207615 | A1 | 10/2004 | Yumoto |
| 2005/0140600 | A1 | 6/2005 | Kim et al. |
| 2006/0066253 | A1 | 3/2006 | Kim |
| 2006/0145960 | A1 | 7/2006 | Koga et al. |
| 2008/0084365 | A1* | 4/2008 | Takahara et al. .............. 345/76 |

FOREIGN PATENT DOCUMENTS

| JP | 8-46213 | 2/1996 |
| JP | 8-313870 | 11/1996 |
| JP | 2001109399 | * 4/2001 |

(Continued)

OTHER PUBLICATIONS

Patent Abstracts of Japan, Publication No. 08-046213; Date of Publication: Feb. 16, 1996; in the name of Hack Michael G, et al.

(Continued)

*Primary Examiner*—Bipin Shalwala
*Assistant Examiner*—Kelly Hegarty
(74) *Attorney, Agent, or Firm*—Christie, Parker & Hale, LLP

(57) ABSTRACT

An organic light emitting display is disclosed capable of displaying an image of uniform luminance regardless of a leakage current. The display includes scan and data lines crossing each other. The display further includes red, green, and blue pixels having red, green, and blue organic light emitting diodes (OLEDs), respectively. Switch sections are respectively included in the red, green, and blue pixels for transferring a data signal to the data lines according to a scan signal from the scan lines. Driving circuits are respectively included in the red, green, and blue pixels for supplying a current to red, green, and blue OLEDs connected thereto according to the data signal from the switch sections. At least one of the respective switch sections included in the red, green, and blue pixels has a different number of transistors than at least one other of the respective switch sections.

22 Claims, 10 Drawing Sheets

FOREIGN PATENT DOCUMENTS

| | | |
|---|---|---|
| JP | 2001-183704 | 7/2001 |
| JP | 2003-224461 | 8/2003 |
| JP | 2003-317961 | 11/2003 |
| JP | 2004-310014 | 11/2004 |
| JP | 2007-10872 | 1/2007 |
| KR | 2001-0018089 | 3/2001 |
| KR | 10-0354643 | 9/2002 |
| KR | 10-2004-0079167 | 9/2004 |

OTHER PUBLICATIONS

Patent Abstracts of Japan, Publication No. 2001-183704; Date of Publication: Jul. 6, 2001; in the name of Mase Akira et al.
Patent Abstracts of Japan, Publication No. 2003-317961; Date of Publication: Nov. 7, 2003; in the name of Yamauchi Yukio et al.
Korean Patent Abstracts corresponding to Registered Patent No. 10-035643, Publication No. 1020010067258 A; Date of Publication: Jul. 12, 2001; in the name of Komiya Naoaki et al.
European Search Report dated Sep. 24, 2007, for EP 07113665.9, in the name of Samsung SDI Co., Ltd.
English translation of Korean Office action dated Jul. 31, 2007, previously filed Oct. 16, 2007.
Patent abstracts of Japan for publication No. 08-313870 published Nov. 29, 1996 in the name of Sukeji Kato.
Patent abstracts of Japan for publication No. 2003-224461 published Aug. 8, 2003 in the name of Shoichiro Matsumoto.
Patent abstracts of Japan for publication No. 2007-010872 published Jan. 18, 2007 in the name of Yasumasa Goto.
Korean patent abstracts for publication No. 1020010018089 A published Mar. 5, 2001 in the name of Ung Sik Choi, et al.
Patent Abstracts of Japan; Publication No. 2004-310014; dated Nov. 4, 2004; in the name of Oh-Kyong Kwon.
Korean Patent Abstracts, Publication No. 1020040079167 A; Date of Publication: Sep. 14, 2004; in the name of Ok Hui Kim, et al.
Office action dated Jul. 31, 2007, for corresponding Korean Patent Application No. 10-2006-0074588.

* cited by examiner

ORGANIC LIGHT EMITTING DISPLAY

CROSS-REFERENCE TO RELATED APPLICATIONS

This application claims priority to and the benefit of Korean Patent Application No. 10-2006-0074588, filed on Aug. 8, 2006, in the Korean Intellectual Property Office, the entire content of which is incorporated herein by reference.

BACKGROUND

1. Field of the Invention

The present invention relates to an organic light emitting display, and more particularly to an organic light emitting display capable of displaying an image of uniform luminance regardless of a leakage current.

2. Discussion of Related Art

Various flat plate displays with reduced weight and volume in comparison to cathode ray tubes (CRT) have been developed. Flat panel displays include liquid crystal displays (LCD), field emission displays (FED), plasma display panels (PDP), and organic light emitting displays.

Among the flat panel displays, the organic light emitting displays make use of organic light emitting diodes that emit light by re-combination of electrons and holes. The organic light emitting display has advantages of high response speed and small power consumption.

FIG. 1 is a circuitry diagram showing a pixel of a conventional organic light emitting display.

With reference to FIG. 1, the pixel 4 of a conventional organic light emitting display includes an organic light emitting diode OLED and a pixel circuit 2. The pixel circuit 2 is coupled between a data line Dm and a scan line Sn, and controls the organic light emitting diode OLED.

An anode electrode of the organic light emitting diode OLED is coupled with the pixel circuit 2, and a cathode electrode thereof is coupled to a second power supply ELVSS. The organic light emitting diode OLED generates light of a predetermined luminance corresponding to an electric current supplied from the pixel circuit 2.

When a scan signal is provided to a scan line Sn, the pixel circuit 2 receives a data signal from the data line Dm, and controls an amount of an electric current supplied to the organic light emitting diode OLED according to the data signal. In order to do this, the pixel circuit 2 includes a first transistor M1, a second transistor M2, and a storage capacitor Cst. The second transistor M2 is coupled between a first power supply ELVDD and the organic light emitting diode OLED. The first transistor Ml is coupled among the second transistor M2, the data line Dm, and the scan line Sn. The storage capacitor Cst is coupled between a gate electrode and a first electrode of the first transistor M1.

A gate electrode of the first transistor M1 is coupled to the scan line Sn, and a first electrode thereof is coupled to the data line Dm. A second electrode of the first transistor M1 is coupled with the gate electrode of the second transistor M2. The first and second electrodes may be either the drain or source electrodes. For example, the first electrode may be the source electrode and the second electrode may be the drain electrode. When a scan signal is supplied to the scan line Sn, the first transistor M1 is turned on to supply the data signal from the data line Dm to the gate electrode of the second transistor M2. At this time, the storage capacitor Cst is charged with a voltage corresponding to the data signal.

The gate electrode of the second transistor M2 is coupled to one terminal of the storage capacitor Cst, and a first electrode thereof is coupled to another terminal of the storage capacitor Cst and the first power supply ELVDD. The second electrode of the second transistor M2 is coupled to an anode electrode of the organic light emitting diode OLED. The second transistor M2 controls an amount of an electric current from the first power supply ELVDD to the second power supply ELVSS through the organic light emitting diode OLED according to the voltage stored in the storage capacitor Cst. The organic light emitting diode OLED generates light corresponding to an amount of an electric current supplied from the second transistor M2.

So as to express a desired image in the aforementioned pixel 4, the voltage charged in the storage capacitor Cst, namely, the voltage corresponding to the data signal should stably maintain during one frame. However, in the conventional pixel 4, during a displayed time period of the image, a predetermined leakage current from the storage capacitor Cst is supplied to the data line Dm through the first transistor M1.

As described earlier, when the leakage current occurs, the voltage stored in the storage capacitor Cst varies. According to a variation voltage of the storage capacitor Cst, when the luminance of the red pixel R, the green pixel G, and the blue pixel B change by the same value, a uniform image may be displayed. Accordingly, observers cannot recognize the change in luminance due to the leakage current.

However, due to properties of materials of red, green, and blue light emitting diodes included in the red, green, and blue pixels, although voltage variation amounts of the storage capacitor Cst are identical with each, an amount of light generated by the red, green, and blue pixels may be different from each other.

That is, emission efficiency may be expressed by the following equation 1 based on properties of current used materials:

$$OLED(G) > OLED(R) > OLED(B) \quad (1).$$

Accordingly, when the same voltage varies in the storage capacitor Cst, the greatest luminance varies in the green organic light emitting diode OLED(G), whereas the least luminance varies in the blue organic light emitting diode OLED(B). When luminance variation amounts of the red, green, and blue pixels are differently set due to the leakage current, a uniform image cannot be expressed. This causes observers to observe a luminance variation due to the leakage current.

SUMMARY OF THE INVENTION

An organic light emitting display capable of displaying an image of uniform luminance regardless of a leakage current is provided. The organic light emitting display includes scan lines and data lines crossing each other. The display further includes a red pixel including a red organic light emitting diode, a green pixel including a green organic light emitting diode, and a blue pixel including a blue organic light emitting diode. Switch sections are respectively included in the red, green, and blue pixels for transferring a data signal to the data lines according to a scan signal from the scan lines. Driving circuits are respectively included in the red, green, and blue pixels for supplying a current to red, green, and blue organic light emitting diodes connected thereto according to the data signal from the switch sections. At least one of the respective switch sections included in the red, green, and blue pixels has a different number of transistors than at least one other of the respective switch sections.

According to a second aspect of an exemplary embodiment of the present invention, an organic light emitting display is provided including scan lines and emission control lines formed parallel with each other. Data lines cross the scan lines. The display further includes a red pixel including a red organic light emitting diode; a green pixel including a green organic light emitting diode; a blue pixel including a blue organic light emitting diode. Switch sections are respectively included in the red, green, and blue pixels for transferring a data signal to the data lines according to a scan signal from an i-th scan lines ('i' is a natural number). Driving circuits are respectively included in the red, green, and blue pixels for supplying a current to red, green, and blue organic light emitting diodes connected thereto according to the data signal from the switch sections. Initialization sections are respectively included in the red, green, and blue pixels for supplying an initialization power source to the driving circuits when the scan signal is provided to an i-1 th scan line. At least one of the respective initialization sections included in the red, green, and blue pixels has a different number of transistors than at least one other of the respective initialization sections.

DETAILED DESCRIPTION

Figure 1:
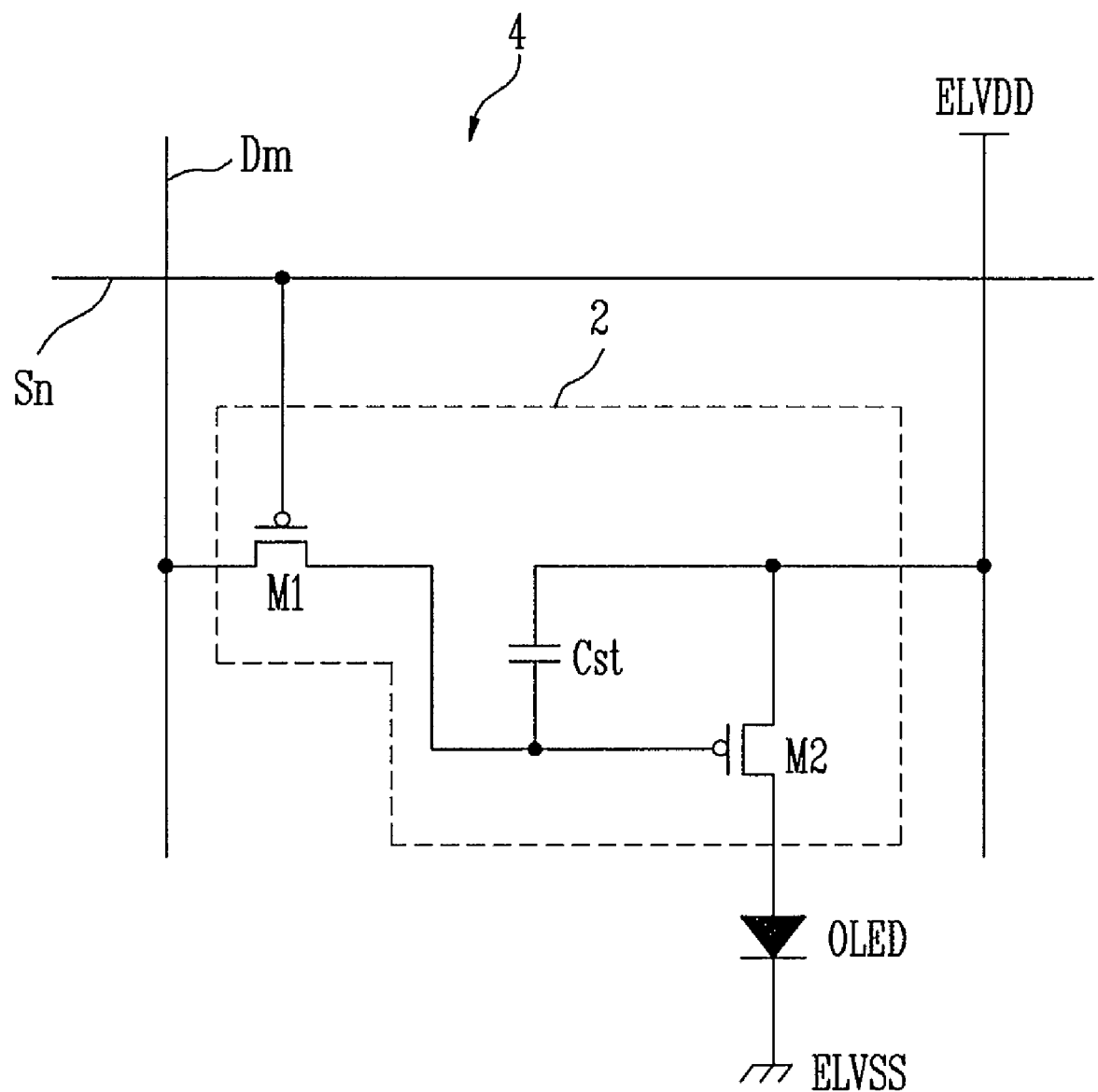
FIG. 1 is a circuitry diagram showing a pixel of a conventional organic light emitting display.

Hereinafter, exemplary embodiments according to the present invention will be described with reference to the accompanying drawings. When a first element is connected to a second element, the first element may be not only directly connected to the second element but also indirectly connected to the second element via another element. Further, irrelative elements are omitted for clarity. Also, like reference numerals refer to like elements throughout.

Figure 2:
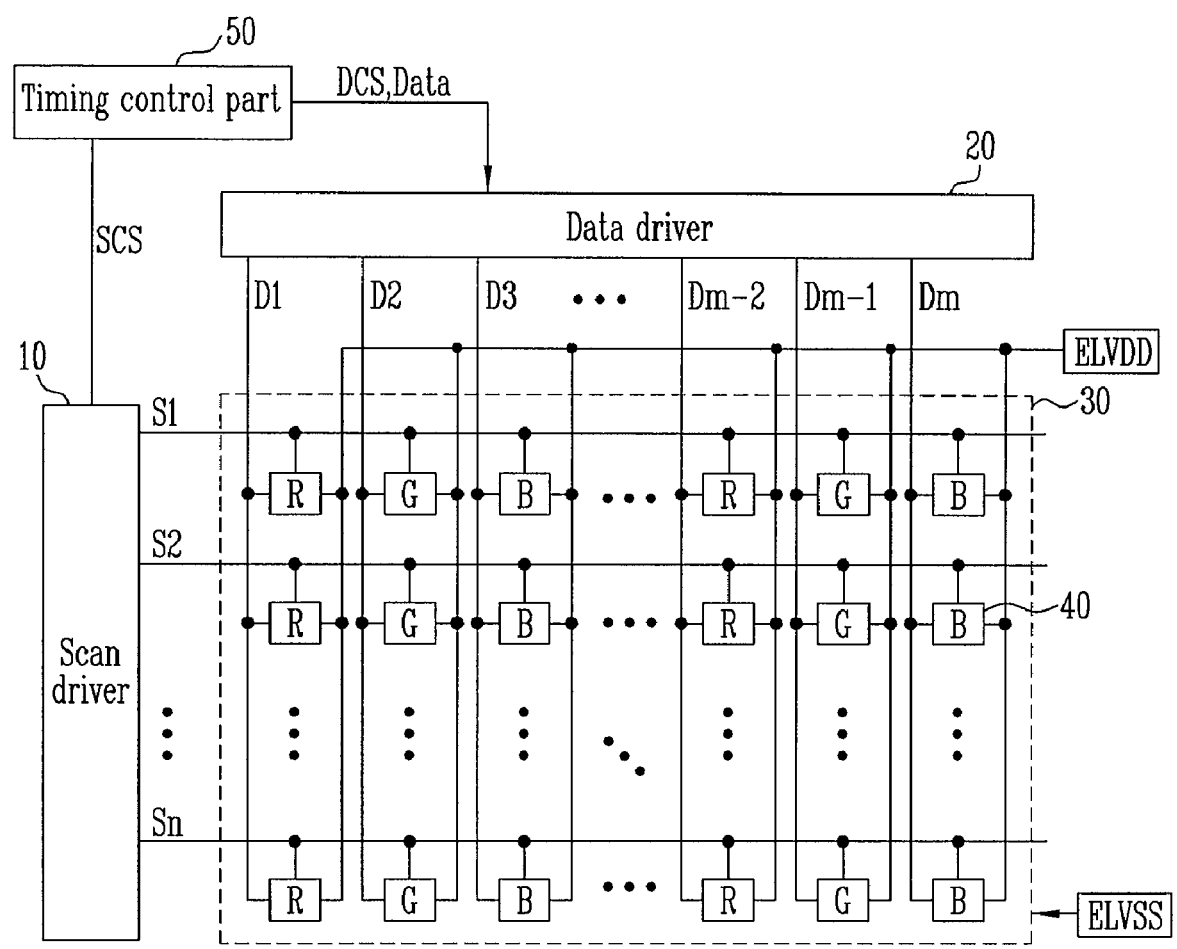
FIG. 2 is a view showing an organic light emitting display according to a first embodiment of the present invention.

Referring to FIG. 2, the organic light emitting display according to the first embodiment of the present invention includes a pixel portion 30 having pixels 40, a scan driver 10, a data driver 20, and a timing control unit 50. The pixels 40 are connected to scan lines S1 through Sn and data lines D1 through Dm. The scan driver 10 drives the scan lines S1 through Sn. The data driver 20 drives the data lines D1 through Dm. The timing control unit 50 controls the scan driver 10 and the data driver 20.

The scan driver 10 receives the scan driving control signal SCS form a timing control unit 50. The scan driver 10 that receives the scan driving control signal sequentially provides a scan signal to the scan lines S1 through Sn.

The data driver 20 receives a data driving signal DCS from the timing control part 50. The data driver 20 that receives the data driving signal DCS generates and provides a data signal to the data lines D1 through Dm in synchronization with the data signal.

The timing control part 50 generates a data driving signal DCS and a scan driving signal SCS corresponding to synchronizing signals supplied externally. The data driving signal DCS generated from the timing control part 50 is provided to the data driver 20, and the scan driving signal SCS is provided to the scan driver 10. Further, the timing control unit 50 provides an externally supplied data Data to the data driver 20.

The pixel portion 30 receives power of the first power supply ELVDD and power of the second power supply ELVSS externally and provides the first and second power supplies to the pixels 40. When the pixels 40 receive the power of the first power supply ELVDD and the power of the second power supply ELVSS, they generate light corresponding to a data signal.

The pixels 40 are divided into a red pixel R, a green pixel G, and a blue pixel B, which generate red light, green light, and blue light, respectively, according to the data signal. In at least one of the red pixel R, the green pixel G, and the blue pixel B, the number of transistor disposed at a leakage path are differently set.

Figure 3:
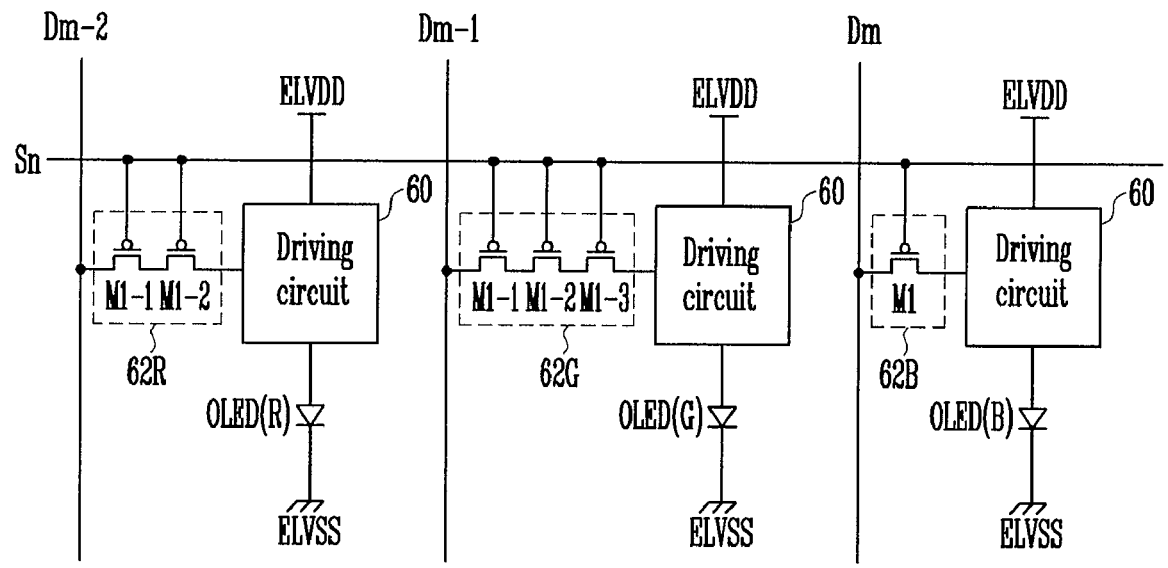
FIG. 3 is a view showing a red pixel, a green pixel, and a blue pixel B shown in FIG. 2.

FIG. 3 is a view showing a red pixel R, a green pixel G, and a blue pixel B shown in FIG. 2.

With reference to FIG. 3, switch sections 62R, 62G, 62B are coupled to the scan line Sn and the respective data line. The number of transistors included in the switch sections 62R, 62G, 62B is set differently according to whether the pixel is a red pixel R, green pixel G, or a blue pixel B. That is, as the emission efficiency increases (refer to the equation 1) of the organic light emitting diode, more transistors are included in each of the switch sections 62R, 62G, 62B. Thus, the number of the transistors are increased in proportion to the emission efficiency.

Specifically, three transistors M1-1, M1-2, M1-3 are formed at the switch section 62G of the green pixel G, which includes a green organic light emitting diode OLED(G). When the three transistors M1-1, M1-2, M1-3 are formed between the driving circuit 60 and the data line Dm-1, an amount of a leakage current supplied to the data line Dm-1 from the driving circuit 60 can be minimized.

Two transistors M1-1, M1-2 are formed at the switch section 62R of the red pixel R, which includes a red organic light emitting diode OLED(R). When the two transistors M1-1, M1-2 are formed between the driving circuit 60 and the data line Dm-2, an amount of a leakage current more than that in the green pixel G is supplied from the driving circuit 60 to the data line Dm-2.

One transistor M1 is formed at the switch section 62B of the blue pixel B, which includes a blue organic light emitting diode OLED(B). When the transistor M1 is formed between the driving circuit 60 and the data line Dm, an amount of a leakage current more than that in the red pixel R is supplied from the driving circuit 60 to the data line Dm.

That is, in an exemplary embodiment of the present invention, in consideration of emission efficiencies of the organic light emitting diodes OLED(R), OLED(G), OLED(B), the number of transistors disposed between the scan line Sn and the driving circuit 60 is controlled. When the number of transistors disposed between the scan line Sn and the driving circuit 60 is set in proportion to emission efficiency, the present invention can display an image of uniform luminance irrespective of a leakage current. The least amount of leakage current occurs in a green pixel G of the best emission efficiency, whereas the most amount of leakage occurs in a blue pixel B of the worst emission efficiency. Accordingly, variation amounts of the luminance of the organic light emitting diodes OLED(R), OLED(G), OLED(B) are uniformly set, thereby causing an image of uniform luminance to be displayed.

For convenience of a description, FIG. 3 shows two transistors M1-1, M1-2, three transistors M1-1, M1-2, M1-3, and one transistor M1, which are formed at the red, green, and blue pixels R, G, and B, respectively. The present invention is not limited thereto. In practice, the number of the transistors in the red, green, and blue pixels R, G, and B may be variously controlled in consideration of emission efficiencies thereof.

The driving circuit 60 included in each of the red, green, and blue pixels R, G, and B supplies a predetermined current from the first power supply ELVDD to the organic light emitting diodes OLED(R), OLED(G), OLED(B) according to the data signal. Here, the driving circuit 60 may be variously constructed to supply an electric current corresponding to the data signal to the organic light emitting diodes OLED(R), OLED(G), OLED(B).

Figure 4:
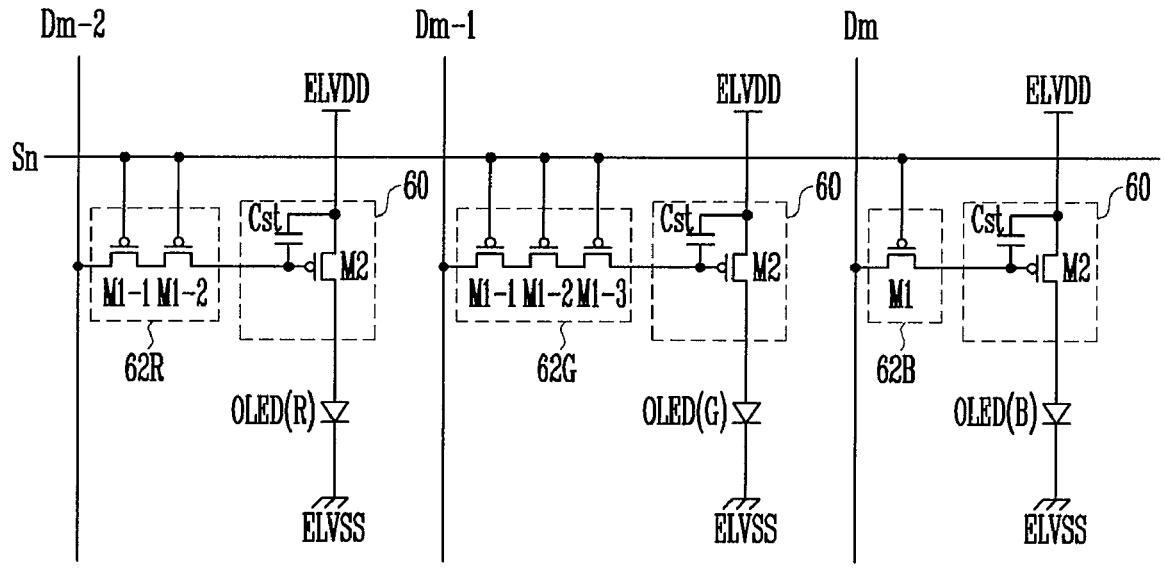
FIG. 4 is a circuitry diagram showing a construction of a driving circuit shown in FIG. 3.

For example, as shown in FIG. 4, the driving circuit 60 may include a second transistor M2 and a storage capacitor Cst. The second transistor M2 is coupled to the switch section 62R, 62G, 62B, the organic light emitting diodes OLED(R), OLED(G), OLED(B), and the first power supply ELVDD. The storage capacitor Cst is disposed between a gate electrode and a first electrode of the second transistor M2.

The storage capacitor Cst is charged with a voltage corresponding to a data signal supplied through the switch section 62R, 62G, 62B. The second transistor M2 supplies an electric current to the organic light emitting diodes OLED(R), OLED(G), OLED(B), which corresponds to the voltage charged in the storage capacitor Cst.

Figure 5:
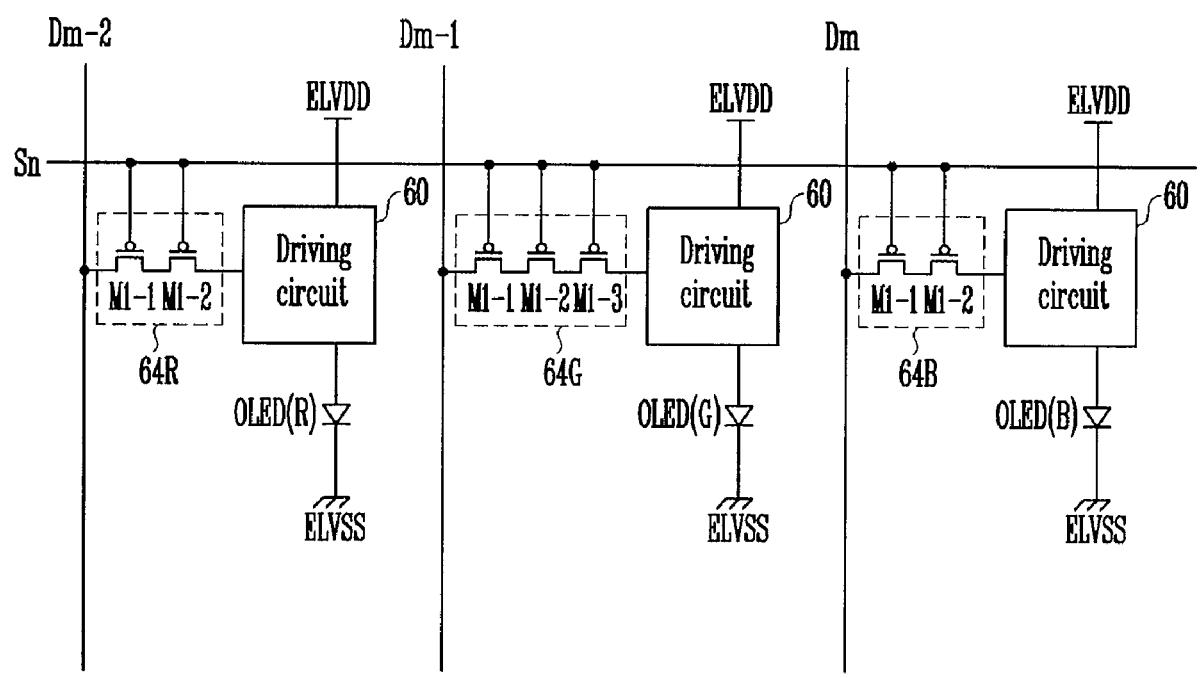
FIG. 5 is a view showing another example of a red pixel, a green pixel, and a blue pixel B shown in FIG. 2.

FIG. 5 is a view showing another example of a red pixel R, a green pixel G, and a blue pixel B shown in FIG. 2. With reference to FIG. 5, in the second embodiment of the present invention, the number of transistors included in a switch section 64G of a green pixel G is set to be different from that of transistors included in red and blue pixels R and B. In other words, in the second embodiment of the present invention, the switch section 64R of the red pixel R and the switch section 64B of the blue pixel B contains the same number of transistors.

Specifically, as is seen from the forgoing description, emission efficiencies of organic light emitting diodes OLED(R), OLED(G), OLED(B) are determined by the equation 1. Emission efficiency differences between red and blue organic light emitting diodes OLED(R), OLED(B) are small. In other words, the emission efficiencies of the red and blue organic light emitting diodes OLED(R), OLED(B) are similarly set. Accordingly, although the numbers of transistors in each of the switch sections 64R, 64G, 64B are equally set, a great luminance difference does not occur.

For convenience of a description, FIG. 5 shows two transistors M1-1, M1-2, three transistors M1-1, M1-2, M1-3, and two transistors M1-1, M1-2, which are formed at the red, green, and blue pixels R, G, and B, respectively. However, the present invention is not limited thereto. In practice, the number of the transistors in the red, green, and blue pixels R, G, and B may be variously controlled in consideration of emission efficiencies thereof.

Figure 6:
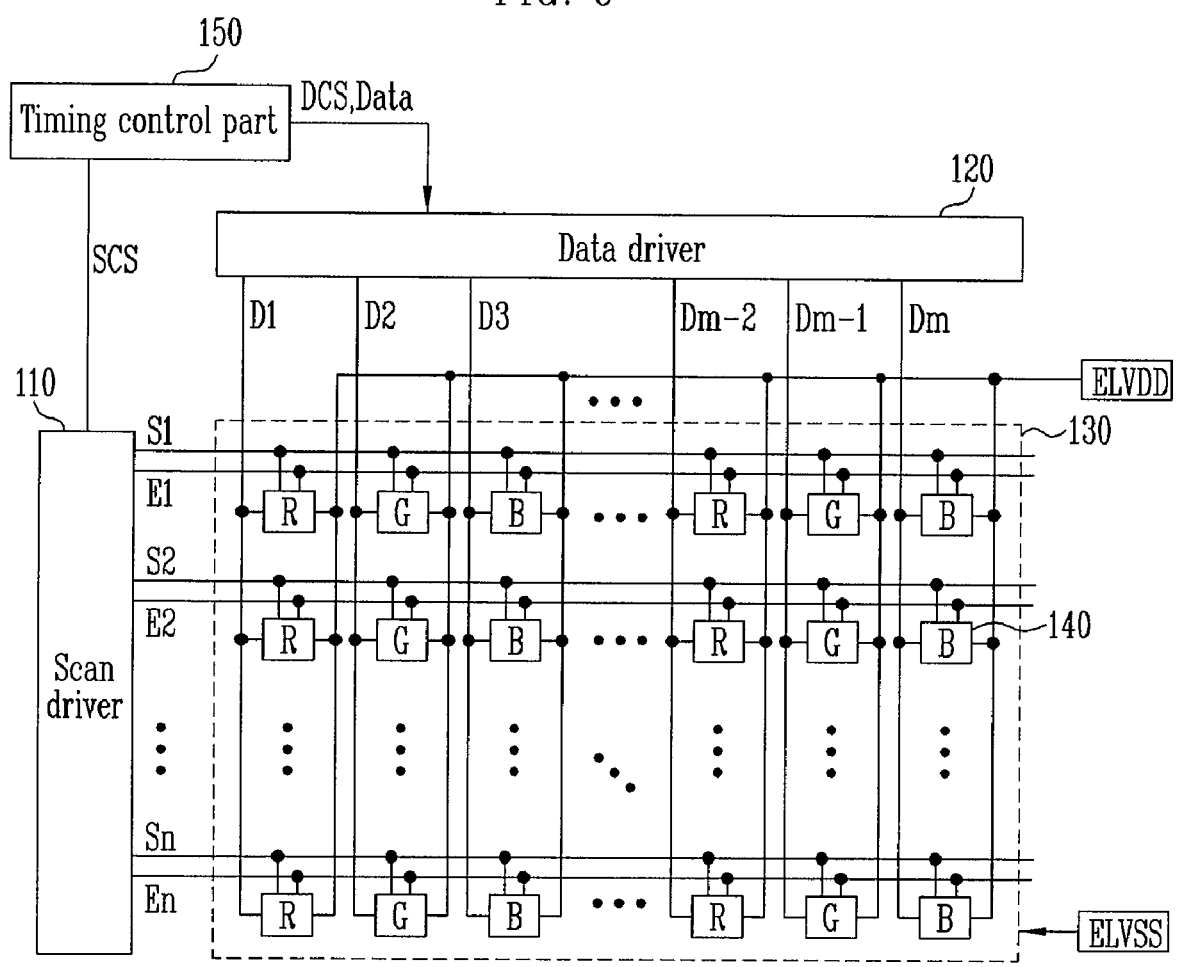
FIG. 6 is a view showing an organic light emitting display according to a second embodiment of the present invention.

FIG. 6 is a view showing an organic light emitting display according to a second embodiment of the present invention.

Referring to FIG. 6, the organic light emitting display according to the second embodiment of the present invention includes a pixel portion 130 having pixels 140, a scan driver 110, a data driver 120, and a timing control unit 150. The pixels 140 are connected to scan lines S1 through Sn, emission control lines E1 through En, and data lines D1 through Dm. The scan driver 110 drives the scan lines S1 through Sn and emission control lines E1 through En. The data driver 120 drives the data lines D1 through Dm. The timing control unit 150 controls the scan driver 110 and the data driver 120.

The scan driver 110 receives the scan driving control signal SCS form a timing control unit 50. The scan driver 110 having received the scan driving control signal sequentially provides a scan signal to the scan lines S1 through Sn. Further, the scan driver 110 generates an emission control signal, and sequentially provides the emission control signal to the emission control lines E1 through En. An emission control signal supplied to an i-th emission control line Ei is supplied to overlap with an i-th scan line Si. In practice, the emission control signal is set to have a greater width than that of the scan signal.

The data driver 120 receives a data driving signal DCS from the timing control part 150. The data driver 120 that receives the data driving signal DCS generates and provides a data signal to the data lines D1 through Dm in synchronization with the data signal.

The timing control part 150 generates a data driving signal DCS and a scan driving signal SCS corresponding to synchronizing signals supplied externally. The data driving signal DCS generated from the timing control part 150 is provided to the data driver 120, and the scan driving signal SCS is provided to the scan driver 110. Further, the timing control unit 150 provides an externally supplied data Data to the data driver 120.

The pixel portion 130 receives power of the first power supply ELVDD and power of the second power supply ELVSS externally and provides the first and second power supplies to the pixels 140. When the pixels 140 receive the power of the first power supply ELVDD and the power of the second power supply ELVSS, they generate light corresponding to a data signal. The pixels 140 are divided into a red pixel R, a green pixel G, and a blue pixel B, which generate red light, green light, and blue light, respectively, according to the data signal. On the other hand, emission times of the pixels 140 are controlled by the emission control signal.

Figure 7:
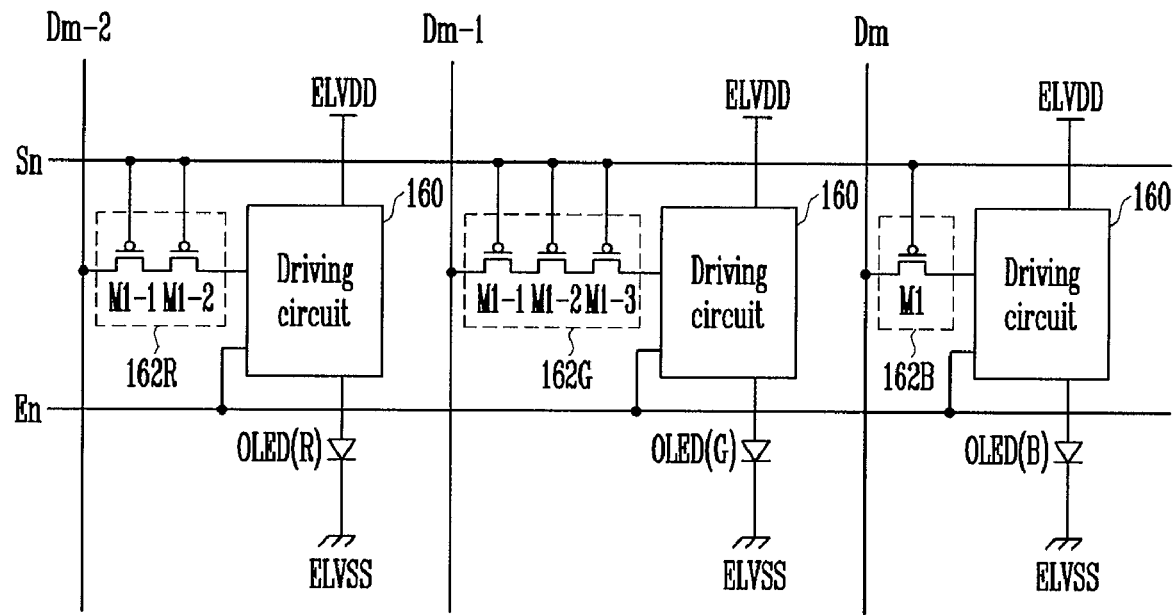
FIG. 7 is a view showing a red pixel, a green pixel, and a blue pixel B shown in FIG. 6.

FIG. 7 is a view showing a red pixel R, a green pixel G, and a blue pixel B shown in FIG. 6. The pixels of FIG. 7 have an identical structure to that of the pixels of FIG. 5 except that the driving circuits 160 are coupled with the emission control line En.

Referring to FIG. 7, the switch sections 162R, 162G, 162B are coupled to the scan line Sn and the respective data signal. The number of transistors included in the switch sections 162R, 162G, 162B of red, green, and blue pixels R, G, and B are set differently to each other according to emission efficiencies of organic light emitting diodes OLED(R), OLED(G), OLED(B).

That is, three transistors M1-1, M1-2, M1-3 are formed at a switch section 162G of the green pixel G, which includes a green organic light emitting diode OLED (G). Further, one transistor M1 is formed at a switch section 162B of the blue pixel B, which includes a blue organic light emitting diode OLED (B). Moreover, two transistors M1-1, M1-2 are formed at a switch section 162R of the red pixel R, which includes a red organic light emitting diode OLED (R).

When the number of transistors disposed at the switch section 162R, 162G, 162B is set corresponding to emission efficiency, the present invention can display an image of uniform luminance irrespective of a leakage current. The least amount of leakage current occurs in a green pixel G of the best emission efficiency, whereas the most amount of leakage occurs in a blue pixel B of the worst emission efficiency. Accordingly, variation amounts of the luminance of the organic light emitting diodes OLED(R), OLED(G), OLED (B) are uniformly set, thereby causing an image of uniform luminance to be displayed.

For convenience of a description, FIG. 7 shows two transistors M1-1, M1-2, three transistors M1-1, M1-2, M1-3, and one transistor M1, which are formed at the red, green, and blue pixels R, G, and B, respectively. However, the present invention is not limited thereto. In practice, the number of the transistors in the red, green, and blue pixels R, G, and B may be various controlled in consideration of emission efficiencies thereof.

The driving circuits 160 provide a predetermined current from the first power supply ELVDD to the organic light emitting diodes OLED(R), OLED(G), OLED(B) corresponding to a data signal. The driving circuits 160 control an emission time according to an emission control signal from the emission control line En. A construction of the driving circuit 160 is coupled to an emission control line, and is variously set to control the emission time according to the emission control signal from the emission control line.

Figure 8:
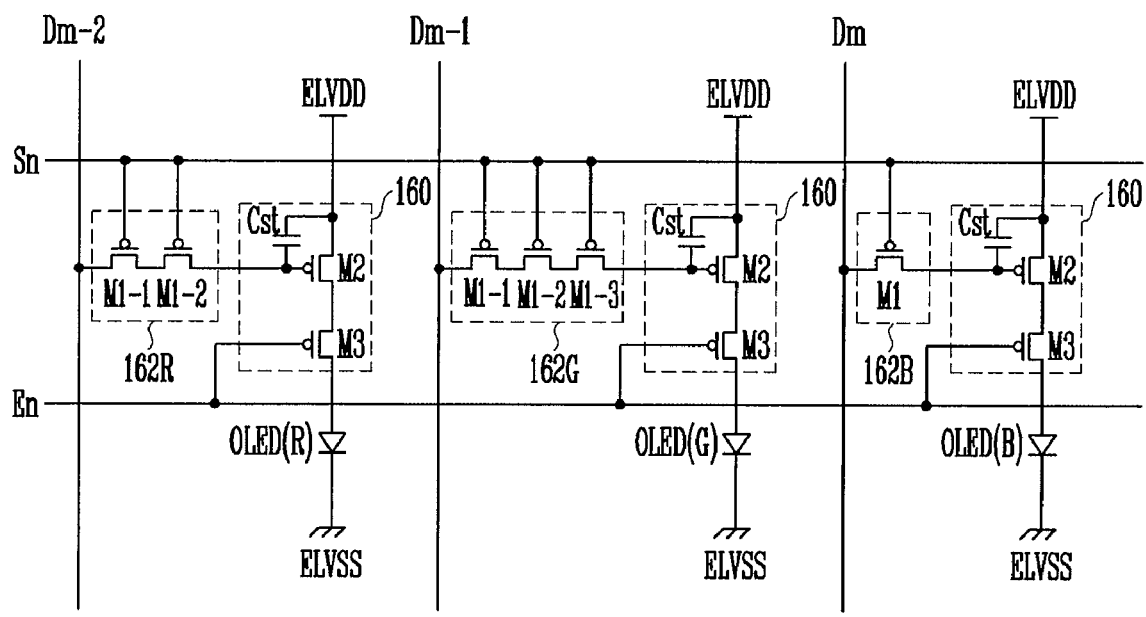
FIG. 8 is a circuitry diagram showing a construction of a driving circuit shown in FIG. 7.

For example, as shown in FIG. 8, the driving circuit 160 may include a second transistor M2, a storage capacitor Cst, and a third transistor M3. The second transistor M2 is coupled to the switch section 162R, 162G, 162B, the organic light emitting diodes OLED(R), OLED(G), OLED(B), and the first power supply ELVDD. The storage capacitor Cst is disposed between a gate electrode and a first electrode of the second transistor M2. The third transistor M3 is coupled to the second transistor M2 and the organic light emitting diodes OLED(R), OLED(G), OLED(B).

The storage capacitor Cst is charged with a voltage corresponding to a data signal supplied through the switch section 162R, 162G, 162B. The second transistor M2 supplies an electric current to the organic light emitting diodes OLED(R), OLED(G), OLED(B), which corresponds to the voltage charged in the storage capacitor Cst. When the emission control signal is supplied to the third transistor M3, it is turned on. In contrast to this, the third transistor M3 is turned-off during remaining time periods.

The emission control signal is supplied to the n-th emission control line En to overlap with the scan signal, which is supplied to the n-th scan line Sn. While the storage capacitor Cst is being charged with a voltage corresponding to the data signal, the third transistor M3 is turned-off. After the storage capacitor Cst is charged with a desired voltage, the third transistor M3 is turned on.

Figure 9:
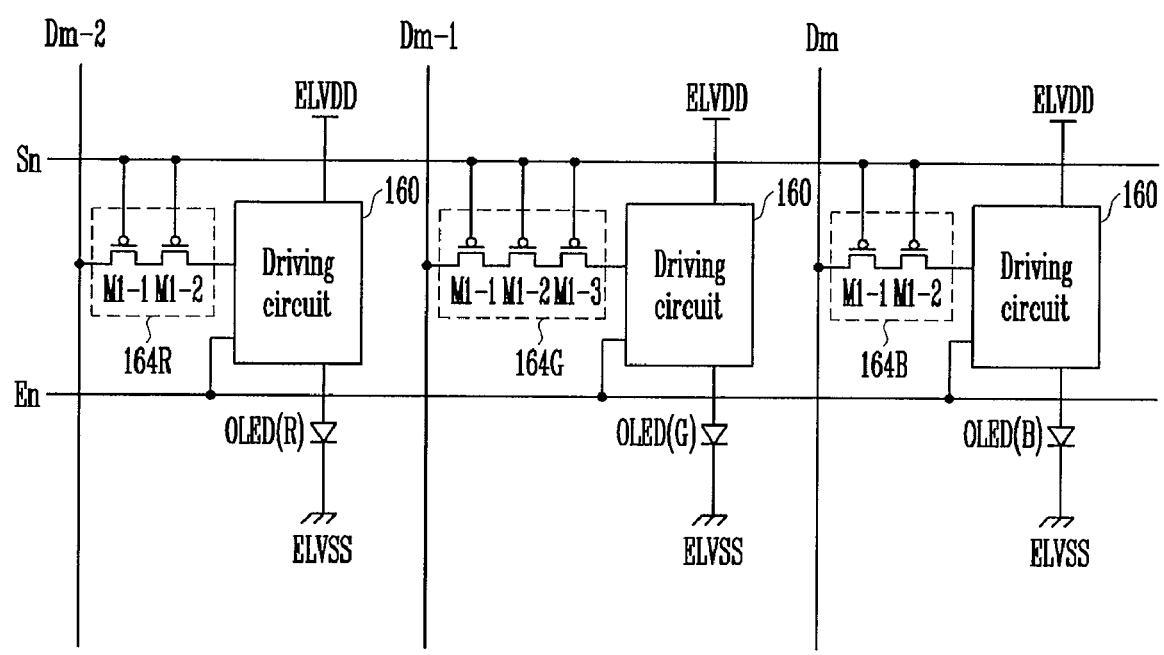
FIG. 9 is a view showing another example of a red pixel, a green pixel, and a blue pixel B shown in FIG. 6.

FIG. 9 is a view showing another example of a red pixel R, a green pixel G, and a blue pixel B shown in FIG. 6. With reference to FIG. 9, in the second embodiment of the present invention, the number of transistors included in a switch section 164G of a green pixel G is set to be different from that of transistors included in red and blue pixels R and B. In other words, in the second embodiment of the present invention, the switch section 164R of the red pixel R and the switch section 164B of the blue pixel B have the same number of transistors.

In detail, as is seen from the forgoing description, emission efficiencies of organic light emitting diodes OLED(R), OLED(G), OLED(B) are determined by the equation 1. Emission efficiency differences between red and blue organic light emitting diodes OLED(R), OLED(B) are small. In other words, the emission efficiencies of the red and blue organic light emitting diodes OLED(R), OLED(B) are similarly set. Accordingly, although the number of transistors in the switch sections 164R, 164G, 164B is equally set, a great luminance difference does not occur.

For convenience of a description, FIG. 9 shows two transistors M1-1, M1-2, three transistors M1-1, M1-2, M1-3, and two transistors M1-1, M1-2, which are formed at the red, green, and blue pixels R, G, and B, respectively. However, the present invention is not limited thereto. In practice, the number of the transistors in the red, green, and blue pixels R, G, and B may be various controlled in consideration of emission efficiencies thereof.

The aforementioned pixel 140 of FIG. 8 has a general circuit arrangement to drive the organic light emitting diode OLED. However, pixel 140 structured by the circuit arrangement of FIG. 8 may not allow for a uniform image to be displayed due to non-uniformity in a threshold voltage of the second transistor M2, which supplies an electric current to the organic light emitting diode. Various circuits have been suggested to compensate the non-uniformity in a threshold voltage of the second transistor M2. Among them, a circuit coupled to an initialization power supply for compensating the non-uniformity in a threshold voltage of the second transistor M2 has widely been used.

Figure 10:
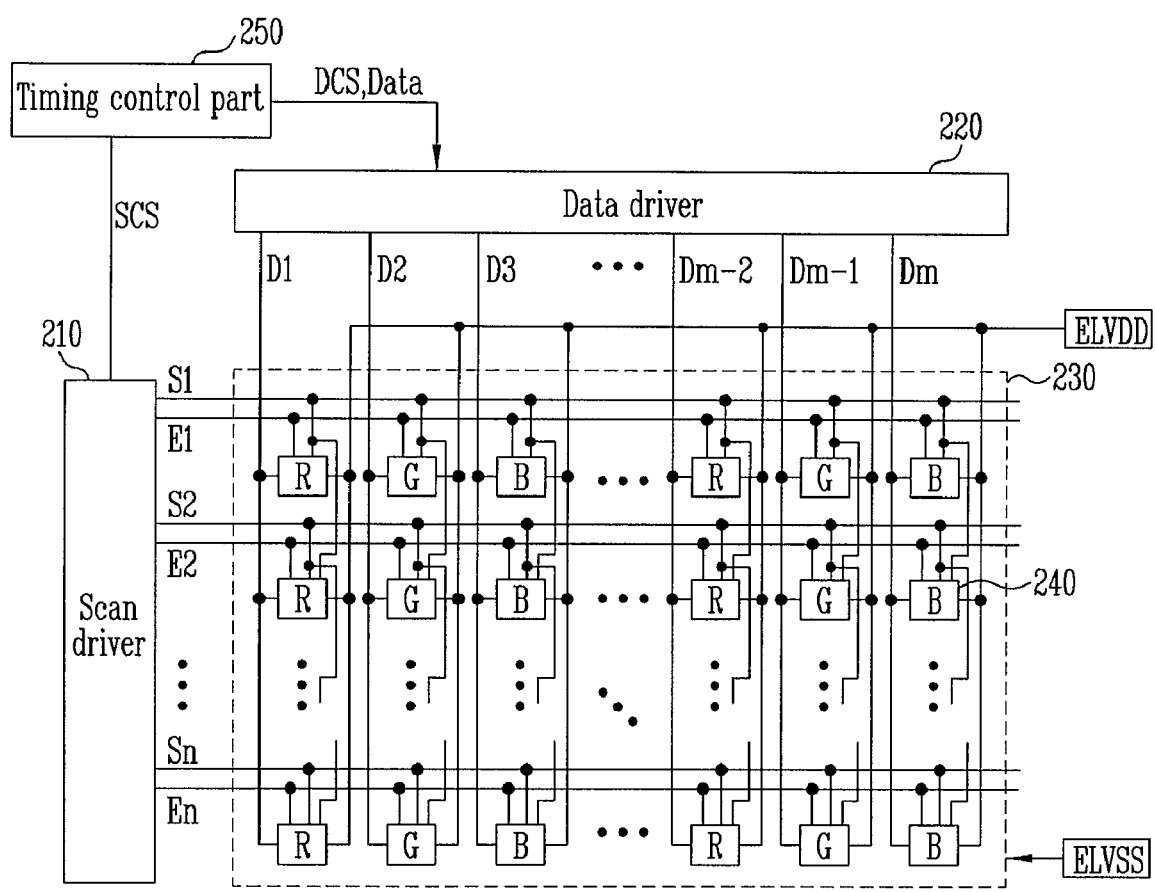
FIG. 10 is a view showing an organic light emitting display according to a third embodiment of the present invention.

FIG. 10 is a view showing an organic light emitting display according to a third embodiment of the present invention.

Referring to FIG. 10, the organic light emitting display according to the third embodiment of the present invention includes a pixel portion 230 having pixels 240, a scan driver 210, a data driver 220, and a timing control unit 250. The pixels 240 are connected to scan lines S1 through Sn and data lines D1 through Dm. The scan driver 210 drives the scan lines S1 through Sn and emission control lines E1 through En. The data driver 220 drives the data lines D1 through Dm. The timing control unit 250 controls the scan driver 210 and the data driver 220.

The scan driver 210 receives the scan driving control signal SCS from a timing control unit 250. The scan driver 210 that receives the scan driving control signal sequentially provides a scan signal to the scan lines S1 through Sn. Further, the scan driver 210 generates an emission control signal, and sequentially provides the emission control signal to the emission control lines E1 through En. The emission control signal is set to have a greater width than that of the scan signal.

The data driver 220 receives a data driving signal DCS from the timing control part 250. The data driver 220 that receives the data driving signal DCS generates and provides a data signal to the data lines D1 through Dm in synchronization with the data signal.

The timing control part 250 generates a data driving signal DCS and a scan driving signal SCS corresponding to synchronizing signals supplied externally. The data driving signal DCS generated from the timing control part 250 is provided to the data driver 220, and the scan driving signal SCS is provided to the scan driver 210. Further, the timing control unit 250 provides an externally supplied data Data to the data driver 220.

The pixel portion 230 receives power of the first power supply ELVDD and power of the second power supply ELVSS externally and provides the first and second power supplies to the pixels 240. When the pixels 240 receive the power of the first power supply ELVDD and the power of the second power supply ELVSS, they generate light corresponding to a data signal.

The pixels 240 are divided into a red pixel R, a green pixel G, and a blue pixel B, which generate red light, green light, and blue light, respectively, according to the data signal. On the other hand, emission times of the pixels 240 are controlled by the emission control signal. The number of transistors coupled to an initialization power supply is differently set in one of the red pixel R, the green pixel G, and the blue pixel B. In practice, a lower voltage is set to the initialization power supply for initializing the pixel 240, so that a great leakage current occurs in the transistor, which is coupled to the initialization power supply.

Figure 11:
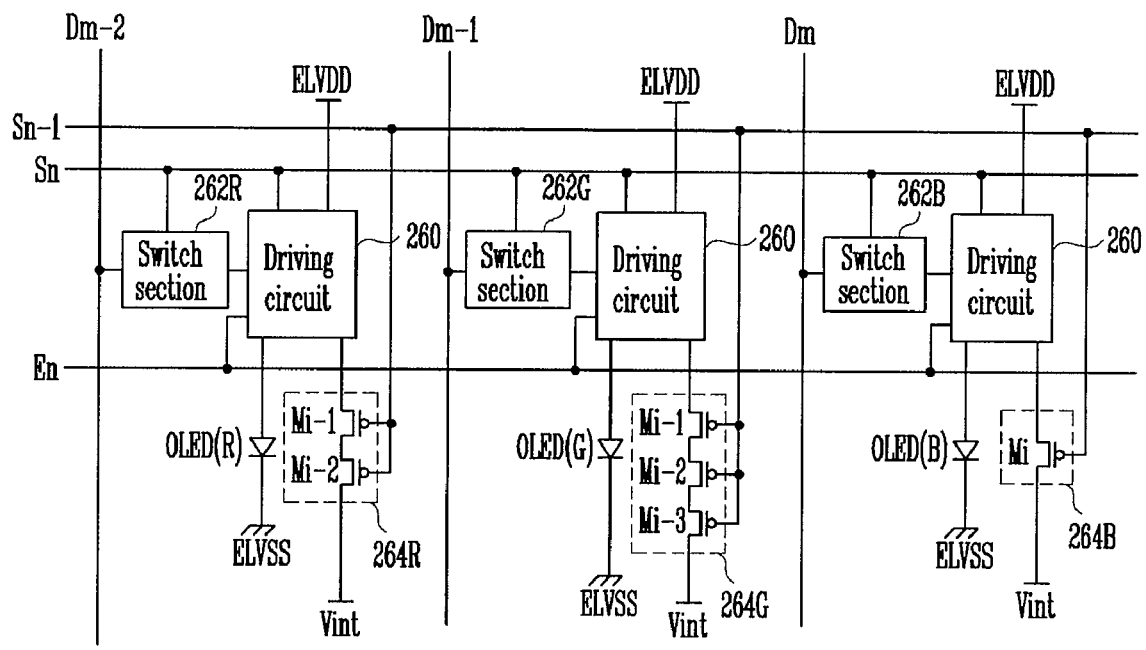
FIG. 11 is a view showing a red pixel, a green pixel, and a blue pixel B shown in FIG. 10.

FIG. 11 is a view showing a red pixel R, a green pixel G, and a blue pixel B shown in FIG. 10.

Referring to FIG. 11, each of the red pixel R, the green pixel G, and the blue pixel B includes one of organic light emitting diodes OLED(R), OLED(G), OLED(B), one of switch section 262R, 262G, 262B, a driving circuit 260, and one of initialization section 264R, 264G, 264B. The switch section 262R, 262G, 262B is connected to the scan line Sn and supplies a data signal thereto. The driving circuit 260 provides an electric current corresponding to the data signal from the switch section 262R, 262G, 262B to the organic light emitting diodes OLED(R), OLED(G), OLED(B). The initialization section 264R, 264G, 264B provides power from the initialization power supply Vint to the driving circuit 260.

Figure 12:
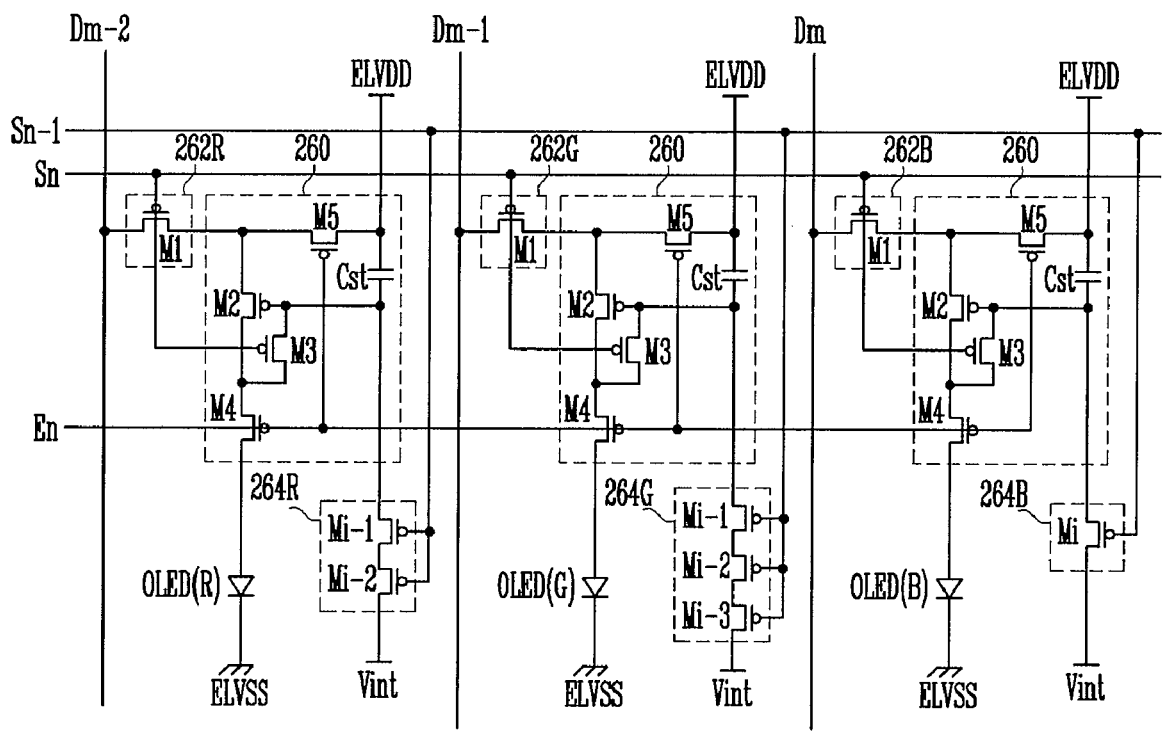
FIG. 12 is a circuitry diagram showing a construction of a driving circuit shown in FIG. 11.

The switch section 262R, 262G, 262B provides a data signal from the data line D to the driving circuit 260 according to the scan signal from the scan line Sn. So as to do this, as shown in FIG. 12, the driving circuit 260 includes a first transistor M1. When the scan signal is supplied to the first transistor M1, it is turned on to electrically connect the scan line Sn and the data line D.

The driving circuit 260 charges a predetermined voltage corresponding to a data signal from the switch section 262R, 262G, 262B, and provides an electric current corresponding to the charged voltage to organic light emitting diodes OLED (R), OLED(G), OLED(B). In order to do this, the driving circuit 260 includes a second transistor M2, a third transistor M3, a fourth transistor M4, a fifth transistor M5, and a storage capacitor Cst.

A first electrode of the second transistor M2 is connected to the switch section 262R, 262G, 262B, and a second electrode thereof is connected to a first electrode of the fourth transistor M4. Further, a gate electrode of the second transistor M2 is connected to the storage capacitor Cst. The second transistor M2 transfers an electric current corresponding to a voltage charged in the storage capacitor Cst to the organic light emitting diodes OLED(R), OLED(G), OLED(B).

A first electrode of the third transistor M3 is connected to the second electrode of the second transistor M2, and a second electrode thereof is connected to the gate electrode of the second transistor M2. Further, a gate electrode of the third transistor M3 is connected to an n-th scan line Sn. When the scan signal is supplied to the n-th scan line Sn (namely, current scan line), the third transistor M3 is turned on to diode-connect the second transistor M2.

A first electrode of the fourth transistor M4 is connected to the second electrode of the second transistor M2, and a second electrode thereof is connected to anode electrodes of the organic light emitting diodes OLED(R), OLED(G), OLED (B). Further, a gate electrode of the fourth transistor M4 is connected to an emission control line En. When the emission control signal is not supplied, the fourth transistor M4 is turned on to transfer an electric current from the second transistor M2 to the organic light emitting diode OLED.

A first electrode of the fifth transistor M5 is connected to the first power supply ELVDD, and a second electrode thereof is connected to a first electrode of the second transistor M2. Further, a gate electrode of the fifth transistor M5 is connected to an emission control line En. When the emission control signal is not supplied to the emission control line En, the fifth transistor M5 is turned on to electrically connect a first electrode of the second transistor M2 to the first power supply ELVDD.

When a scan signal is supplied to an n-1 th scan line Sn-1 (previous scan line), the initialization section 264R, 264G, 264B changes a voltage in the gate electrode of the second transistor M2 in the driving circuit 260 to a voltage of the initialization power supply Vint. So as to do this, the initialization section 264R, 264G, 264B includes at least one transistor. When the scan signal is supplied to the n-1 th scan line Sn-1, the transistor included in the initialization section 264R, 264G, 264B is turned on to electrically connect a gate electrode of the second transistor M2 to the initialization power supply Vint. The number of transistors included in the initialization section 264R, 264G, 264B is differently set according to emission efficiencies of the organic light emitting diodes OLED(R), OLED(G), OLED(B).

Specifically, three transistors Mi-1, Mi-2, Mi-3 are formed at the initialization section 264G of the green pixel G, which includes a green organic light emitting diode OLED (G). Further, one transistor Mi is formed at the initialization section 264B of the blue pixel B, which includes a blue organic light emitting diode OLED (B). And, two transistors Mi-1, Mi-2 are formed at the initialization section 264R of the red pixel R, which includes a red organic light emitting diode OLED (R).

When the number of transistors disposed between the initialization power supply 264R, 264G, 264B is set corresponding to emission efficiency, an image of uniform luminance may be displayed irrespective of a leakage current. In other words, the least amount of leakage current occurs in a green pixel G of excellent emission efficiency, whereas the most amount of leakage occurs in a blue pixel B of the worst emission efficiency. Accordingly, variation amounts of the luminance of the organic light emitting diodes OLED(R), OLED(G), OLED(B) are uniformly set, thereby causing an image of uniform luminance to be displayed.

For convenience of a description, FIG. 11 shows two transistors Mi-1, Mi-2, three transistors Mi-1, Mi-2, Mi-3, and one transistor Mi, which are formed at initialization sections 264R, 264G, 264B of the red, green, and blue pixels R, G, and B, respectively. However, the present invention is not limited thereto. In practice, the number of the transistors in respective initialization sections 264R, 264G, 264B of the red, green, and blue pixels R, G, and B may be variously controlled in consideration of emission efficiencies thereof.

Figure 13:
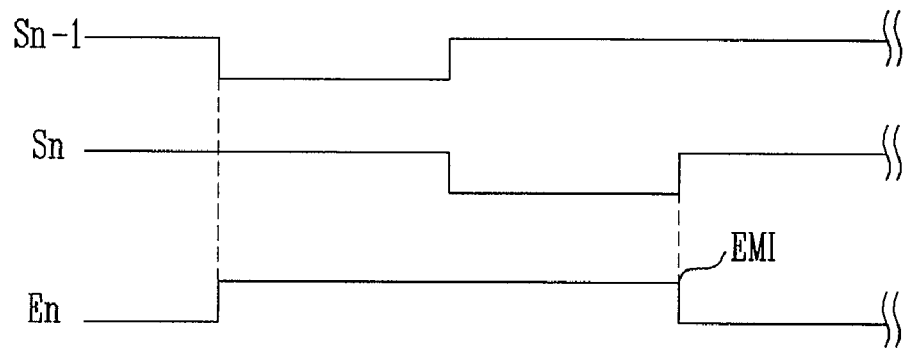
FIG. 13 is a waveform diagram showing a method for driving the pixel shown in FIG. 12.

FIG. 12 is a circuitry diagram showing a construction of a driving circuit shown in FIG. 11. FIG. 13 is a waveform diagram showing a method for driving the pixel shown in FIG. 12.

An operation of the organic light emitting display will be now described of a blue pixel B connected to an n-1 scan line Sn-1 and an m data line Dm, and a waveform of FIG. 13.

Firstly, when a scan signal is supplied to the n-1 scan line Sn-1, initialization transistors included in the initialization section 264B are turned on. When the initialization section 264B are turned on, a voltage of the initialization power supply Vint is provided to one terminal of the storage capacitor Cst and a gate electrode of the second transistor M2.

Because a voltage less than the data signal is set to the initialization power supply Vint, the one terminal of the storage capacitor Cst and the gate electrode of the second transistor M2 are initialized with the voltage of the initialization power supply Vint.

Next, the scan signal is supplied to an n-th scan line Sn. When the scan signal is supplied to an n-th scan line Sn, the first transistor M1 and the third transistor M3 are turned on. When the third transistor M3 is turned on, the second transistor M2 is diode-connected. When the first transistor M1 is turned on, a data signal from the data line Dm is transferred to a first electrode of the second transistor M2. At this time, because a voltage of the gate electrode of the second transistor M2 is set as a voltage of the initialization power supply Vint (namely, is less than a voltage of the data signal), the second transistor M2 is turned on.

When the second transistor M2 is turned on, the data signal is provided to one terminal of the storage capacitor Cst through the second transistor M2 and the third transistor M3. Because the data signal is transferred to the storage capacitor Cst through the second transistor M2, which is diode-connected, the storage capacitor Cst is charged with voltages corresponding to the data signal and a threshold voltage of the second transistor M2.

After the storage capacitor Cst is charged with voltages corresponding to the data signal and a threshold voltage of the second transistor M2, the supply of the emission control signal stops to turn-on the fourth transistor M4 and the fifth transistor M5. When the fourth transistor M4 and the fifth transistor M5 are turned on, a current path is formed from the first power supply ELVDD to the organic light emitting diode OLED. In this case, the second transistor M2 controls an amount of an electric current flowing from the first power supply ELVDD to the organic light emitting diode OLED corresponding to the voltage charged in the storage capacitor Cst.

Here, the storage capacitor Cst included in the pixel 240 is charged with a voltage corresponding to the threshold voltage of the second transistor M2 as well as the data signal, so that it can control an electric current flowing to the organic light emitting diode OLED regardless of the threshold voltage of the second transistor M2. In the event, each pixel 240 may display an image of uniform luminance irrespective of the threshold voltage of the second transistor M2.

Figure 14:
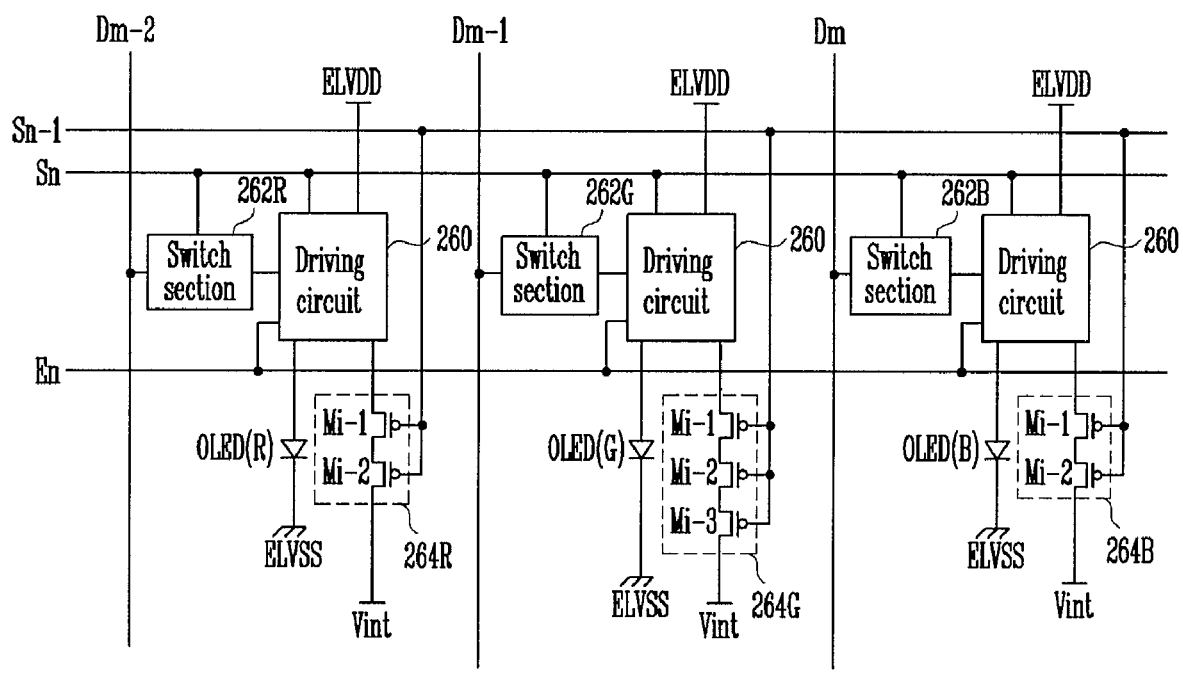
FIG. 14 is a view showing another example of a red pixel, a green pixel, and a blue pixel B shown in FIG. 10.

FIG. 14 is a view showing another example of a red pixel R, a green pixel G, and a blue pixel B shown in FIG. 10. With reference to FIG. 14, in the second embodiment of the present invention, the number of transistors included in a switch section 264G of a green pixel G is set to be different from that of transistors included in red and blue pixels R and B. In other words, in the second embodiment of the present invention, the switch section 264R for the red pixel R and the switch section 264B for the blue pixel B contains the same number of transistors.

Specifically, as is seen from the forgoing description, emission efficiencies of organic light emitting diodes OLED(R), OLED (G), OLED(B) are determined by the equation 1. Emission efficiency differences between red and blue organic light emitting diodes OLED(R), OLED (B) are small. In other words, the emission efficiencies of the red and blue organic light emitting diodes OLED(R), OLED (B) are similarly set. Accordingly, although the number of transistors in the switch sections 264R, 264G, 264B is equally set, a great luminance difference does not occur.

For convenience of a description, FIG. 14 shows two transistors Mi-1, Mi-2, three transistors Mi-1, Mi-2, Mi-3, and two transistors Mi-1, Mi-2, which are formed at respective initialization sections 264R, 264G, 264B of the red, green, and blue pixels R, G, and B, respectively. However, the present invention is not limited thereto. In practice, the number of the transistors in respective initialization sections 264R, 264G, 264B of the red, green, and blue pixels R, G, and B may be variously controlled in consideration of emission efficiencies thereof.

On the other hand, in consideration of emission efficiencies of the organic light emitting diodes OLED(R), OLED(G), OLED(B), the number of transistors included in the switch section 262R, 262G, 262B of FIG. 11 and FIG. 14 may be also controlled. For example, the number of transistors included in the switch section 262R, 262G, 262B can be set as illustrated with reference to FIG. 7 and FIG. 9.

As is clear from the forgoing description, in the organic light emitting display according to exemplary embodiments of the present invention, because the number of transistors disposed at a leakage path is set according to emission efficiencies of organic light emitting diodes, it may display an image having uniform luminance. That is, the number of transistors is set to reduce leakage current in a pixel, which includes an organic light emitting diode having higher emission efficiency. In contrast to this, the number of transistors is set to allow a greater leakage current to flow in a pixel, which includes an organic light emitting diode having lower emission efficiency. Accordingly, amounts of light varied due to a leakage current are similarly set in respective organic light emitting diodes, with the result that an image of an uniform luminance can be displayed.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display comprising:
   scan lines and data lines crossing each other;
   a red pixel having a red organic light emitting diode, a red pixel switch section, and a red pixel driving circuit;
   a green pixel having a green organic light emitting diode, a green pixel switch section, and a green pixel driving circuit;
   a blue pixel having a blue organic light emitting diode, a blue pixel switch section, and a blue pixel driving circuit;
   wherein the red pixel switch section, the green pixel switch section, and the blue pixel switch section are adapted to transfer a data signal from the data lines according to a scan signal from the scan lines;
   wherein the red pixel driving circuit, the green pixel driving circuit, and the blue pixel driving circuit are adapted to supply a current to the red organic light emitting diode, the green organic light emitting diode, and the blue organic light emitting diode connected thereto, respectively, according to the data signal from the red pixel switch section, the green pixel switch section, and the blue pixel switch section, respectively,
   wherein at least one of the red pixel switch section, the green pixel switch section, and the blue pixel switch section has a different number of transistors than at least one other of the red pixel switch section, the green pixel switch section, and the blue pixel switch section.

2. The organic light emitting display as claimed in claim 1, wherein the green pixel switch section includes a number of transistors greater than or equal to a number of transistors included in the red pixel switch section, and the red pixel switch section includes a number of transistors greater than or equal to a number of transistors included in the blue pixel switch section.

3. The organic light emitting display as claimed in claim 2, wherein the number of transistors included in the green pixel switch section is greater than the number of transistors included in the red pixel switch section and is greater than the number of transistors included in the blue pixel switch section.

4. The organic light emitting display as claimed in claim 3, wherein the number of transistors included in the red pixel switch section is greater than the number of transistors included in the blue pixel switch section.

5. The organic light emitting display as claimed in claim 3, wherein the same number of transistors is included in the red pixel switch section and the blue pixel switch section.

6. The organic light emitting display as claimed in claim 1, wherein each of the red pixel driving circuit, the green pixel driving circuit, and the blue pixel driving circuit includes a storage capacitor and a second transistor, the storage capacitor being adapted to store a voltage corresponding to the data signal supplied from a respective one of the switch sections, and the second transistor being adapted to supply an electric current corresponding to the voltage stored in the storage capacitor to a respective one of the organic light emitting diodes.

7. The organic light emitting display as claimed in claim 6, wherein each of the red pixel driving circuit, the green pixel driving circuit, and the blue pixel driving circuit further includes a third transistor disposed between the second transistor and the respective one of the organic light emitting diodes, a gate of the third transistor being coupled to a respective one of emission control lines formed parallel with the scan lines.

8. The organic light emitting display as claimed in claim 1, further comprising:
 a scan driver adapted to sequentially supply the scan signal to the scan lines; and
 a data driver adapted to supply the data signal to the data lines in synchronization with the scan signal.

9. The organic light emitting display as claimed in claim 7, further comprising:
 a scan driver adapted to sequentially supply the scan signal to the scan lines, and to sequentially supply an emission control signal to the emission control lines; and
 a data driver adapted to supply the data signal to the data lines in synchronization with the scan signal.

10. An organic light emitting display comprising:
 scan lines and emission control lines formed parallel with each other; data lines crossing the scan lines;
 a red pixel having a red organic light emitting diode, a red pixel switch section, a red pixel driving circuit, and a red pixel initialization section;
 a green pixel having a green organic light emitting diode, a green pixel switch section, a green pixel driving circuit, and a green pixel initialization section;
 a blue pixel having a blue organic light emitting diode, a blue pixel switch section, a blue pixel driving circuit, and a blue pixel initialization section;
 wherein the red pixel switch section, the green pixel switch section, and the blue pixel switch section are adapted to transfer a data signal from the data lines according to a scan signal from an i-th scan line of the scan lines;
 wherein the red pixel driving circuit, the green pixel driving circuit, and the blue pixel driving circuit are adapted to supply a current to the red organic light emitting diode, the green organic light emitting diode, and the blue organic light emitting diode connected thereto, respectively, according to the data signal from the red pixel switch section, the green pixel switch section, and the blue pixel switch section, respectively; and
 wherein the red pixel initialization section, the green pixel initialization section, and the blue pixel initialization section are adapted to supply an initialization power source to a respective one of the driving circuits when the scan signal is provided to an i-1 th scan line of the scan lines,
 wherein at least one of the red pixel initialization section, the green pixel initialization section, and the blue pixel initialization section has a different number of transistors than at least one other of the red pixel initialization section, the green pixel initialization section, and the blue pixel initialization section.

11. The organic light emitting display as claimed in claim 10, wherein the green pixel initialization section includes a number of transistors greater than or equal to a number of transistors included in the red pixel initialization section, and the red pixel switch initialization includes a number of transistors greater than or equal to a number of transistors included in the blue pixel initialization section.

12. The organic light emitting display as claimed in claim 11, wherein the number of transistors included in the green pixel initialization section is greater than the number of transistors included in the red pixel initialization section and greater than the number of transistors included in the blue pixel initialization section.

13. The organic light emitting display as claimed in claim 12, wherein the number of transistors included in the red pixel initialization section is greater than the number of transistors included in the blue pixel initialization section.

14. The organic light emitting display as claimed in claim 12, wherein the same number of transistors is included in the red pixel initialization section and the blue pixel initialization section.

15. The organic light emitting display as claimed in claim 10, wherein each of the red pixel switch section, the green pixel switch section, and the blue pixel switch section includes a first transistor, a gate of the first transistor being coupled to the scan i-th line.

16. The organic light emitting display as claimed in claim 15, wherein each of the red pixel driving circuit, the green pixel driving circuit, and the blue pixel driving circuit includes:
 a storage capacitor charged with a voltage corresponding to the data signal;
 a second transistor coupled to one terminal of the storage capacitor adapted to supply an electric current corresponding to the voltage charged in the storage capacitor to a respective one of the organic light emitting diodes;
 a third transistor coupled between a gate electrode and a second electrode of the second transistor, a gate of the third transistor being coupled to the i-th scan line;
 a fifth transistor coupled between the second transistor and another terminal of the storage capacitor, a gate of the fifth transistor being coupled to a respective one of the emission control lines; and
 a fourth transistor coupled between the second transistor and the respective one of the organic light emitting diodes, a gate of the fourth transistor being coupled to the respective one of the emission control lines.

17. The organic light emitting display as claimed in claim 10, further comprising:
- a scan driver adapted to sequentially supply the scan signal to the scan lines, and to sequentially supply the emission control signal to the emission control lines; and
- a data driver adapted to supply the data signal to the data lines in synchronization with the scan signal.

18. The organic light emitting display as claimed in claim 10, wherein at least one of the red pixel switch section, the green pixel switch section, and the blue pixel switch section has a different number of transistors than at least one other of the red pixel switch section, the green pixel switch section, and the blue pixel switch section.

19. The organic light emitting display as claimed in claim 18, wherein the green pixel switch section includes a number of transistors greater than or equal to a number of transistors included in the red pixel switch section, and the red pixel switch section includes a number of transistors greater than or equal to a number of transistors included in the blue pixel switch section.

20. The organic light emitting display as claimed in claim 19, wherein the number of transistors included in the green pixel switch section is greater than the number of transistors included in the red pixel switch section and greater than the number of transistors included in the blue pixel switch section.

21. The organic light emitting display as claimed in claim 20, wherein the number of transistors included in the red pixel switch section is greater than the number of transistors included in the blue pixel switch section.

22. The organic light emitting display as claimed in claim 20, wherein the same number of transistors is included in the red pixel switch section and the blue pixel switch section.

* * * * *

UNITED STATES PATENT AND TRADEMARK OFFICE
CERTIFICATE OF CORRECTION

PATENT NO.       : 7,796,107 B2                                Page 1 of 1
APPLICATION NO.  : 11/693585
DATED            : September 14, 2010
INVENTOR(S)      : Yang Wan Kim It is certified that error appears in the above-identified patent and that said Letters Patent is hereby corrected as shown below:

In the Claims

Column 14, Claim 15, line 42        Delete "scan i-th"
                                    Insert -- i-th scan --

Signed and Sealed this
Tenth Day of January, 2012

David J. Kappos
*Director of the United States Patent and Trademark Office*